(12) United States Patent
Wu et al.

(10) Patent No.: US 10,050,018 B2
(45) Date of Patent: Aug. 14, 2018

(54) 3DIC STRUCTURE AND METHODS OF FORMING

(71) Applicant: Taiwan Semiconductor Manufacturing Company, Ltd., Hsin-Chu (TW)

(72) Inventors: Kuo-Ming Wu, Zhubei (TW); Yung-Lung Lin, Taichung (TW); Zhi-Yang Wang, Taichung (TW); Sheng-Chau Chen, Tainan (TW); Cheng-Hsien Chou, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 80 days.

(21) Appl. No.: 15/054,402

(22) Filed: Feb. 26, 2016

(65) Prior Publication Data
US 2017/0250160 A1  Aug. 31, 2017

(51) Int. Cl.
*H01L 25/065* (2006.01)
*H01L 25/00* (2006.01)
*H01L 23/00* (2006.01)

(52) U.S. Cl.
CPC .......... *H01L 25/0657* (2013.01); *H01L 24/02* (2013.01); *H01L 25/50* (2013.01)

(58) Field of Classification Search
None
See application file for complete search history.

(56) References Cited

U.S. PATENT DOCUMENTS

| | | | |
|---|---|---|---|
| 6,028,367 A * | 2/2000 | Yu | H01L 23/3677 257/706 |
| 7,564,115 B2 | 7/2009 | Chen et al. | |
| 7,633,165 B2 | 12/2009 | Hsu et al. | |
| 7,825,024 B2 | 11/2010 | Lin et al. | |
| 7,973,413 B2 | 7/2011 | Kuo et al. | |
| 8,105,875 B1 | 1/2012 | Hu et al. | |
| 8,158,456 B2 | 4/2012 | Chen et al. | |
| 8,183,578 B2 | 5/2012 | Wang | |
| 8,183,579 B2 | 5/2012 | Wang | |
| 8,227,902 B2 | 7/2012 | Kuo | |
| 8,278,152 B2 | 10/2012 | Liu et al. | |
| 8,426,961 B2 | 4/2013 | Shih et al. | |
| 8,669,174 B2 | 3/2014 | Wu et al. | |
| 8,802,504 B1 | 8/2014 | Hou et al. | |
| 8,803,292 B2 | 8/2014 | Chen et al. | |

(Continued)

*Primary Examiner* — Tom Thomas
*Assistant Examiner* — Steven B Gauthier
(74) *Attorney, Agent, or Firm* — Slater Matsil, LLP

(57) ABSTRACT

A method is provided. The method includes providing a first wafer having a plurality of first dummy pads exposed along a first surface of the first wafer. The first dummy pads contact a first metallization layer of the first water. The method also includes providing a second wafer having a plurality of second dummy pads exposed along a first surface of the second wafer. The second dummy pads contact a second metallization layer of the second wafer. The method also includes bonding the first wafer to the second wafer in a manner that the first surface of the first wafer contacts the first surface of the second wafer and the plurality of first dummy pads are interleaved with the plurality of second dummy pads but do not contact the plurality of second dummy pads.

20 Claims, 5 Drawing Sheets

(56) References Cited

U.S. PATENT DOCUMENTS

| | | |
|---|---|---|
| 8,803,316 B2 | 8/2014 | Lin et al. |
| 2007/0018331 A1* | 1/2007 | Chen .................. H01L 23/562 |
| | | 257/774 |
| 2007/0267755 A1* | 11/2007 | Vo ........................ H01L 24/06 |
| | | 257/775 |
| 2011/0095418 A1* | 4/2011 | Lim ................. H01L 23/3128 |
| | | 257/737 |
| 2013/0063918 A1* | 3/2013 | Haba ............. H01L 23/49827 |
| | | 361/772 |
| 2013/0284885 A1* | 10/2013 | Chen .................... H01L 25/16 |
| | | 250/208.1 |
| 2014/0001645 A1 | 1/2014 | Lin et al. |
| 2014/0225258 A1 | 8/2014 | Chiu et al. |
| 2014/0252572 A1 | 9/2014 | Hou et al. |
| 2015/0279888 A1* | 10/2015 | Chen ................ H01L 23/5226 |
| | | 257/459 |
| 2015/0287697 A1 | 10/2015 | Tsai et al. |
| 2015/0348872 A1 | 12/2015 | Kuo et al. |
| 2016/0013133 A1* | 1/2016 | Gu .................. H01L 23/53257 |
| | | 257/758 |

\* cited by examiner

3DIC STRUCTURE AND METHODS OF FORMING

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, stacked semiconductor devices, e.g., 3D integrated circuits (3DIC), have emerged as an effective alternative to further reduce the physical size of a semiconductor device. In a stacked semiconductor device, active circuits such as logic, memory, processor circuits and the like are fabricated on different semiconductor wafers. Two or more semiconductor wafers may be installed on top of one another to further reduce the form factor of the semiconductor device.

Two semiconductor wafers may be bonded together through suitable bonding techniques. The commonly used bonding techniques include direct bonding, chemically activated bonding, plasma activated bonding, anodic bonding, eutectic bonding, glass frit bonding, adhesive bonding, thermo-compressive bonding, reactive bonding and/or the like. An electrical connection may be provided between the stacked semiconductor wafers. The stacked semiconductor devices may provide a higher density with smaller form factors and allow for increased performance and lower power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
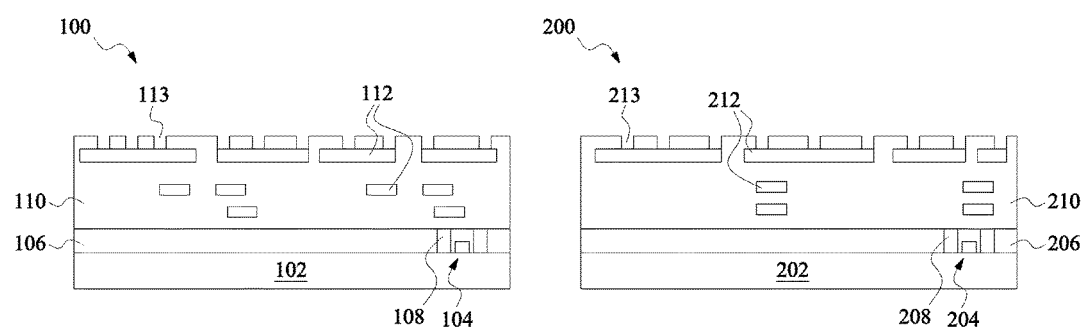
FIGS. 1A and 1B depict cross-sectional views of intermediate stages of forming an interconnect structure between two bonded wafers or dies in accordance with some exemplary embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
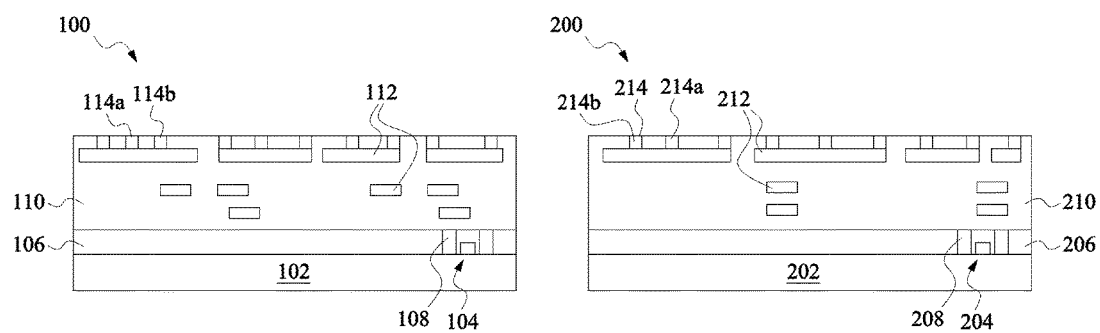
Figure 2:
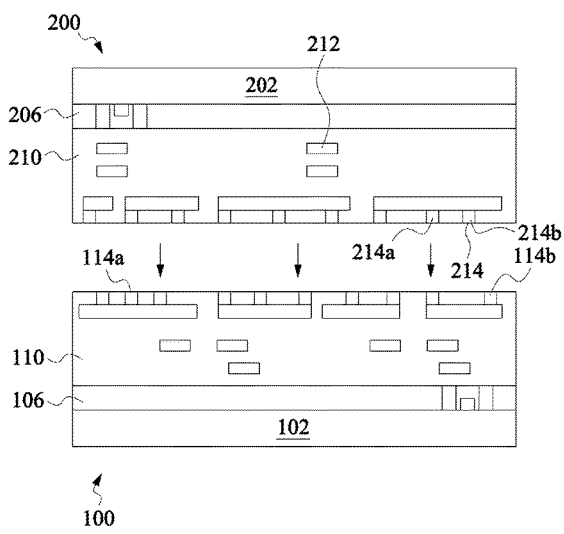
FIG. 2 depicts a cross-sectional view of an intermediate stage of forming an interconnect structure between two bonded wafers or dies in accordance with some exemplary embodiments.
Figure 3:
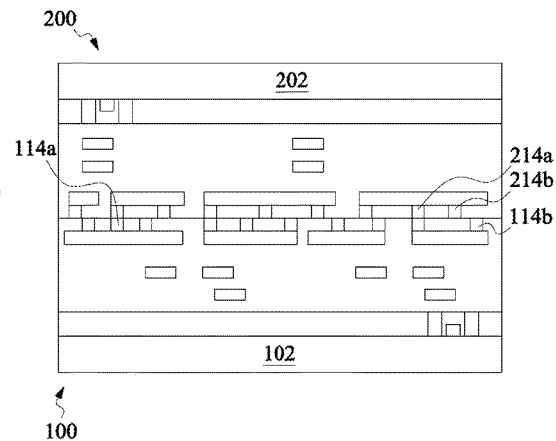
FIG. 3 depicts a cross-sectional view of an interconnect structure between two bonded wafers or dies in accordance with some exemplary embodiments.

FIGS. 1-3 illustrate various intermediate steps of forming an interconnect structure between two bonded wafers or dies in accordance with some embodiments. Referring first to FIGS. 1A and 1B, a first wafer 100 and a second wafer 200 are shown prior to a bonding process in accordance with various embodiments. In some embodiments, second wafer 200 has similar features as first wafer 100, and for the purpose of the following discussion, the features of second wafer 200 having reference numerals of the form "2xx" are similar to features of first wafer 100 having reference numerals of the form "1xx," the "xx" being the same numerals for first wafer 100 and second wafer 200. The various elements of first wafer 100 and second wafer 200 will be referred to as the "first <element> 1xx" and the "second <element>2xx," respectively.

In some embodiments described herein, second wafer 200 is represented as being similar to first wafer 100. However, one of ordinary skill in the art will appreciate that examples described herein are provided for illustrative purposes only to further explain applications of some illustrative embodiments and are not meant to limit the disclosure in any manner. In some embodiments, second wafer 200 may comprise devices and circuitry that is different from first wafer 100. For example, in other embodiments, first wafer 100 may be fabricated using a CMOS process while second wafer 200 may be manufactured using a MEMS process. As another example, in some embodiments, first wafer 100 may be an application-specific integrated circuit (ASIC) wafer and second wafer 200 may be a CMOS image sensor (CIS) wafer. Any type of wafer that is suitable for a particular application may be used for each of first wafer 100 and second wafer 200.

In some embodiments, first wafer 100 comprises a first substrate 102 having a first electrical circuit 104 formed thereon. First substrate 102 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substrates, such as a multi-layered or gradient substrate may also be used.

First electrical circuit 104, formed on first substrate 102, may be any type of circuitry suitable for a particular application. In some embodiments, first electrical circuit 104 includes electrical devices formed on the substrate with one or more dielectric layers overlying the electrical devices. Metal layers may be formed between dielectric layers to route electrical signals between the electrical devices. Electrical devices may also be formed in one or more dielectric layers.

For example, first electrical circuit 104 may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. One of ordinary skill in the art will appreciate that the above examples are provided for illustrative purposes only to further explain applications of the present invention and are not meant to limit the present invention in any manner. Other circuitry may be used as appropriate for a given application.

Also shown in FIGS. 1A and 1B is a first inter-layer dielectric (ILD)/inter-metallization dielectric (IMD) layer 106. First ILD layer 106 may be formed, for example, of a low-K dielectric material, such as phosphosilicate glass (PSG), borophosphosilicate glass (BPSG), FSG, $SiO_xC_y$, Spin-On-Glass, Spin-On-Polymers, silicon carbon material, compounds thereof, composites thereof, combinations thereof, or the like, by any suitable method known in the art, such as spinning, chemical vapor deposition (CVD), and plasma-enhanced CVD (PECVD). It should also be noted that first ILD layer 106 may comprise a plurality of dielectric layers.

First contacts 108 are formed through first ILD layer 106 to provide an electrical contact to first electrical circuit 104. First contacts 108 may be formed, for example, by using photolithography techniques to deposit and pattern a photoresist material on first ILD layer 106 to expose portions of first ILD layer 106 that are to become first contacts 108. An etch process, such as an anisotropic dry etch process, may be used to create openings in first ILD layer 106. The openings may be lined with a diffusion barrier layer and/or an adhesion layer (not shown), and filled with a conductive material. The diffusion barrier layer comprises one or more layers of TaN, Ta, TiN, Ti, CoW, or the like, and the conductive material comprises copper, tungsten, aluminum, silver, and combinations thereof, or the like, thereby forming first contacts 108 as illustrated in FIGS. 1A and 1B.

One or more first additional ILD layers 110 and first interconnect lines 112 form metallization layers over first ILD layer 106. Generally, the one or more first additional ILD layers 110 and the associated metallization layers are used to interconnect the electrical circuitry to each other and to provide an external electrical connection. First additional ILD layers 110 may be formed of a low-K dielectric material, such as fluorosilicate glass (FSG) formed by PECVD techniques or high-density plasma chemical vapor deposition (HDPCVD) or the like, and may include intermediate etch stop layers.

One or more etch stop layers (not shown) may be positioned between adjacent ones of the ILD layers, e.g., first ILD layer 106 and first additional ILD layers 110. Generally, the etch stop layers provide a mechanism to stop an etching process when forming vias and/or contacts. The etch stop layers are formed of a dielectric material having a different etch selectivity from adjacent layers, e.g., the underlying first substrate 102 and the overlying ILD layers 106/110. In an embodiment, etch stop layers may be formed of SiN, SiCN, SiCO, CN, combinations thereof, or the like, deposited by CVD or PECVD techniques.

First external contacts 114 are formed on a top surface of first wafer 100, and second external contacts 214 are formed on a top surface of second wafer 200. In some embodiments, first wafer 100 and second wafer 200 are arranged in a face to face configuration with the device sides of first substrate 102 and second substrate 202 facing each other (depicted in FIGS. 2 and 3). First external contacts 114 and second external contacts 214 may be positioned on the top surfaces of the respective wafers so that certain contacts are in physical contact when first wafer 100 and second wafer 200 are arranged with the device sides facing each other, and therefore provide a means for electrical connection between first wafer 100 and second wafer 200 after they are arranged in the face to face configuration.

Figure 6:
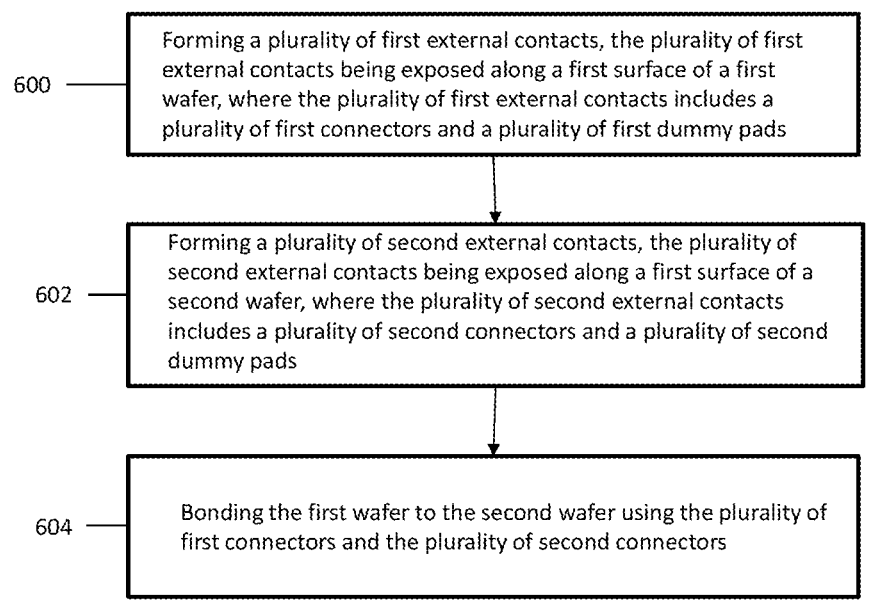
FIG. 6 depicts a flow chart of a method in accordance with some exemplary embodiments.

In some embodiments, first external contacts 114 are formed using the same or similar procedures described above in connection with first interconnect lines 112. For example, photolithography techniques may be used to deposit and pattern a photoresist material on first additional ILD layers no to expose portions of the uppermost first additional ILD layer no that are to become first external contacts 114. An etch process, such as an anisotropic dry etch process, may be used to create openings 113 in the uppermost first additional ILD layer 110 (shown in FIG. 1A). The openings 113 may be lined with a diffusion barrier layer and/or an adhesion layer (not shown), and filled with a conductive material. The diffusion barrier layer comprises one or more layers of TaN, Ta, TiN, Ti, CoW, or the like, and the conductive material comprises copper, tungsten, aluminum, silver, and combinations thereof, or the like, thereby forming first external contacts 114 as illustrated in FIG. 1B. The forming of first external contacts 114 corresponds to step 600 of the method depicted in FIG. 6, and the forming of second external contacts 214 corresponds to step 602 of the method depicted in FIG. 6.

First external contacts 114 may include first connection pads 114a and first dummy pads 114b. First connection pads 114a are pads that, as discussed above, provide an electrical connection between first wafer 100 and second wafer 200 when the wafers are arranged in a face to face configuration. First dummy pads 114b are floating contacts that are not used for electrical connections, but are included to reduce metal dishing and uneven erosion effects on the top surface of first wafer 100 caused by a planarization process performed on the top surface of the first wafer 100. For example, in order for first wafer 100 and second wafer 200 to have a strong bond, the top surfaces of each wafer undergo a planarization process, such as a chemical mechanical polishing process (CMP). If only first connection pads 114a are present, then the CMP process may result in significant metal dishing and/or significant uneven erosion of the top surface of first wafer 100. First dummy pads 114b are therefore included to provide a more uniform surface for the CMP process, which reduces metal dishing and uneven erosion effects on the top surface of first wafer 100 caused by the CMP process.

To reduce metal dishing and erosion effects from the planarization process, first external contacts 114 may be distributed uniformly or substantially uniformly. The (substantially) uniformly distributed first external contacts 114 may be distributed throughout an entirety or substantially the entirety of (for example, more than 90 or 95 percent) of a top surface of first wafer 100. The (substantially) uniformly distributed first external contacts 114 may extend all the way to the edges of the top surface of first wafer 100. Furthermore, all or substantially all of first external contacts 114 throughout the entire first wafer 100 may have a same top-view shape, a same top-view size, and/or a same pitch. In some embodiments, first external contacts may have different top-view sizes or top view shapes. In some embodiments, first external contacts may have top view shapes of circles, squares, polygons, or the like. First external contacts 114 may have a uniform pattern density throughout first wafer 100.

As depicted in FIG. 1B, first external contacts 114 may be directly connected to one or more underlying first interconnect lines 112 in first wafer 100. First connection pads 114a are and second connection pads 214a are arranged on the top surfaces of first wafer 100 and second wafer 200 so that a corresponding first connection pad 114a on first wafer 100 and second connection pad 214a on second wafer 200 will be physically connected when first wafer 100 and second wafer 200 are arranged in a face to face configuration with the device sides of first substrate 102 and second substrate 202 facing each other (depicted in FIGS. 2 and 3). First connection pads 114a and second connection pads 214a therefore provide a means for electrical connection between first interconnect lines 112 and second interconnect lines 212 after the wafers are arranged in the face to face configuration.

As depicted in FIG. 1B, first dummy pads 114b may also be directly connected to one or more first interconnect lines 112 in first wafer 100. As such, if first dummy pads 114b are in physical contact with second dummy pads 214b when first wafer 100 and second wafer 200 are arranged in the face to face configuration, an undesirable and unintended short circuit will be created between first interconnect lines 112 in first wafer 100 and second interconnect lines 212 in second wafer 200. Currently, certain packages are formed so that a top interconnect layer is recessed into the substrate away from the external contacts. Each connection pad in these packages is connected to the top interconnect layer by a conductive via. Dummy pads in these packages are not connected to the top interconnection layer by a conductive via. As such, the dummy pads are floating connectors in these packages. In these packages, dummy pads and connection pads may be placed in corresponding locations in a first wafer and a second wafer, so that when the first wafer and the second wafer are arranged in a face to face configuration the connection pads on the first wafer physically contact the corresponding connection pad on the second wafer, and dummy pads on the first wafer will physically contact dummy pads in the second wafer. Electrical short circuits are prevented from being created by the dummy pads by the fact that the dummy pads are floating connectors and aren't connected to the uppermost interconnection layer.

Notably, the above configuration requires that a layer of conductive vias be formed in each of the first wafer and the second wafer, which requires additional processing time, cost, and consumes additional space in the package. In some embodiments, first dummy pads 114b and second dummy pads 214b may be positioned on the top surface of first wafer 100 and second wafer 200, respectively, so that first dummy pads 114b in first wafer 100 and second dummy pads 214b in second wafer 200 are offset from each other as shown in FIG. 1B, while first connection pads 114a in first wafer 100 and second connection pads 214a in second wafer 200 are positioned in corresponding locations. If first dummy pads 114b in first wafer 100 and second dummy pads 214b second wafer 200 are positioned in a manner that is offset from each other, no physical connection or electrical connection between the dummy pads is created when first wafer 100 is bonded to second wafer 200. The offset positioning of first dummy pads 114b in first wafer 100 and second dummy pads 214b in second wafer 200 may prevent a short circuit from being created. Therefore, the offset positioning of first dummy pads 114b and second dummy pads 214b may enable the package to be formed without any conductive vias connecting the first connection pads 114a to the top first interconnect lines 112, and/or without any conductive vias connecting the second connection pads 214a to the top second interconnect lines 212, which may reduce costs and processing times for the packages.

Next, referring to FIG. 2, first wafer 100 and second wafer 200 are arranged in the face-to face configuration for bonding. As discussed above, before being arranged, first wafer 100 and second wafer 200 may undergo a planarization process to ensure an even bonding surface exists at a top surface of each of first wafer 100 and second wafer 200.

Next, referring to FIG. 3, first wafer 100 is bonded to second wafer 200. To prepare first wafer 100 and second wafer 200 for bonding, surface cleaning and surface activation of first wafer 100 and second wafer 200 may be performed. The surface cleaning is performed to remove CMP slurry and native oxide layers from surfaces of first wafer 100 and second wafer 200. The surface cleaning process may include methods with direct and non-direct contact with the surfaces of the first wafer 100 and the second wafer 200, such as cryogenic cleaning, mechanical wiping and scrubbing, etching in a gas, plasma or liquid, ultrasonic and megasonic cleaning, laser cleaning, and the like. Subsequently, the second wafer 200 may be rinsed in de-ionized (DI) water and dried using a spin dryer or an isopropyl alcohol (IPA) dryer. In other embodiments, first wafer 100 and second wafer 200 may be cleaned using RCA clean, or the like.

In reference to FIG. 3, first wafer 100 is bonded to second wafer 200. In some embodiments, first wafer 100 and second wafer 200 may be bonded using, for example, a direct bonding process such as metal-to-metal bonding (e.g., copper-to-copper bonding), dielectric-to-dielectric bonding (e.g., oxide-to-oxide bonding), metal-to-dielectric bonding (e.g., oxide-to-copper bonding), hybrid bonding (e.g., simultaneous metal-to-metal and dielectric-to-dielectric bonding), any combinations thereof and/or the like. The surface activation may be performed to prepare first wafer 100 and second wafer 200 for bonding. The surface activation process may include suitable processes, such as plasma etch or wet etch processes to remove native oxides, which may be formed after the wafer cleaning process, from the surfaces of first wafer 100 and second wafer 200. Subsequently, first wafer may be rinsed in de-ionized (DI) water and dried using a spin dryer or an isopropyl alcohol (IPA) dryer.

For example, first wafer 100 and second wafer 200 may be bonded using hybrid bonding. First connection pads 114a of first wafer 100 are respectively aligned to second connection pads 214a of second wafer 200. For example, in some embodiments, the surfaces of first wafer 100 and second wafer 200 may be put into physical contact at room temperature, atmospheric pressure, and ambient air, and first connection pads 114a and second connection pads 214a may be bonded using direct metal-to-metal bonding. At the same time, the uppermost first additional ILD layer no of first wafer 100 and the uppermost second additional ILD layer 210 of second wafer 200 may be bonded using direct dielectric-to-dielectric bonding. Subsequently, annealing may be performed to enhance the bonding strength between first wafer 100 and second wafer 200. The bonding of first wafer 100 and second wafer 200 using first connection pads 114a and second connection pads 214a corresponds to step 604 of the method depicted in FIG. 6.

It should be noted that the bonding may be performed at wafer level, wherein first wafer 100 and second wafer 200 are bonded together, and are then singulated into separated dies. Alternatively, the bonding may be performed at the die-to-die level, or the die-to-wafer level.

Figure 4:
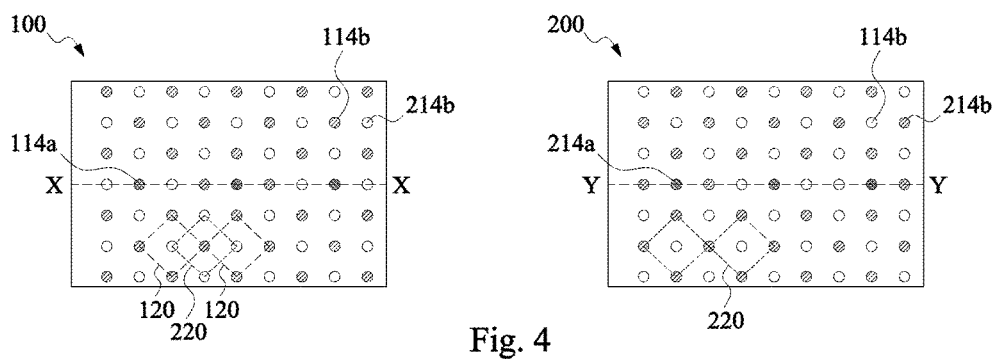
FIG. 4 depicts plan views of a top surface of two wafers in accordance with some exemplary embodiments.

Referring to FIG. 4, plan views of the top surfaces of first wafer 100 and second wafer 200 are shown in accordance with some embodiments. The cross sectional views of FIGS. 1-3 of first wafer 100 are taken along the line X-X of first wafer 100, and the cross sectional views of FIGS. 1-3 of second wafer 200 are taken along the line Y-Y of second wafer 200. As shown in FIG. 4, first connection pads 114a on first wafer 100 and second connection pads 214a on second wafer 200 are positioned in corresponding locations so that respective first connection pads 114a and second connection pads 214a are in physical contact when first wafer 100 and second wafer 200 are arranged in a face to face configuration.

As shown in FIG. 4, the top surfaces of first wafer 100 and second wafer 200 also respectively include first dummy pads 114b and second dummy pads 214b. First dummy pads 114b on first wafer 100 are positioned so that they are offset from the positions of second dummy pads 214b on second wafer 200. The positions of second dummy pads 214b are depicted on first wafer 100 in FIG. 4 to illustrate the offset positioning of first dummy pads 114b and second dummy pads 214b, although the physical location of second dummy pads 214b are on the top surface of second wafer 200 and not on first wafer 100. Similarly, the positions of first dummy pads 114b are depicted on first wafer 100 in FIG. 4 to illustrate the offset positioning of first dummy pads 114b and second dummy pads 214b, although the physical location of second dummy pads 214b are on the top surface of second wafer 200 and not on first wafer 100.

As shown in FIG. 4, in some embodiments first dummy pads 114b are positioned on the top surface of first wafer 100 so that four adjacent first dummy pads 114b form a rhombus shape 120, as shown by the virtual dotted lines of FIG. 4. Second dummy pads 214b on second wafer 200 are also positioned in a complementary manner so that four adjacent second dummy pads 214b on a top surface of second wafer 200 form a rhombus shape 220. The rhombus shapes 120 formed by adjacent first dummy pads 114 may be interleaved with the rhombus shapes 220 formed by adjacent second dummy pads 214b when first wafer is 100 is bonded to second wafer 200. The distance between adjacent first dummy pads 114b on the top surface of first wafer 100 may vary according to the size of first wafer 100 and second wafer 200. In some embodiments, the distance between adjacent first dummy pads 114b along the top surface of first wafer 100 may be about 0.05 μm to about 10.0 μm. Similarly, the distance between adjacent second dummy pads 214b on the top surface of second wafer 200 may vary according to the sizes of first wafer 100 and second wafer 200. In some embodiments, the distance between adjacent second dummy pads 214b along the top surface of second wafer 200 may be about 0.05 μm to about 10.0 μm In some embodiments, first connection pads 114a may be included as one or more points of a rhombus shape 120 on a top surface of first wafer 100. However, in some embodiments the positioning of first connection pads 114a is dependent upon the layout of the underlying electrical circuits and first connection pads 114a may be positioned outside of a rhombus shape 120. Similarly, in some embodiments second connection pads 214a may be included as one or more points of a rhombus shape 220 on a top surface of second wafer 200. However, in some embodiments the positioning of second connection pads 214a is dependent upon the layout of the underlying electrical circuits and second connection pads 214a may be positioned outside of a rhombus shape 220.

In some embodiments, the positioning of the first dummy pads 114b may be affected by the design of uppermost first interconnect lines 112. For example, in some embodiments first dummy pads 114b and second dummy pads 214b may be positioned in a manner that does not overlie an uppermost interconnect line of first interconnect lines 112. In some embodiments, as shown in FIGS. 1-3, first dummy pads 114b overlie and contact first interconnect lines 112. In some embodiments, the position of a particular first dummy pad 114b may overlie more than one interconnect line of first interconnect lines 112. As such, it is possible that first dummy pad 114b may create an undesirable short circuit between two adjacent interconnect lines of first interconnect lines 112. In such a situation, the particular first dummy pad 114b may be slightly moved or removed in order to avoid creating a short circuit between two adjacent interconnect lines of uppermost first interconnect lines 112.

Because of the offset positioning of first dummy pads 114b and second dummy pads 214b, in some embodiments no physical connection is created between first dummy pads 114b on first wafer 100 and second dummy pads 214b when the wafers are arranged in a face to face configuration and unintended short circuits may be avoided. Because of the offset positioning of first dummy pads 114b and second dummy pads 214b, in some embodiments one or more conductive vias between first connection pads 114a and uppermost first interconnect lines 112 in first wafer 100 are unnecessary to electrically isolate first dummy pads 114b and avoid short circuits. Similarly, in some embodiments, because of the offset positioning of first dummy pads 114b and second dummy pads 214b, in some embodiments one or more conductive vias between the second connection pads 214a and an uppermost second interconnect lines 212 in second wafer 200 are unnecessary to electrically isolate the second dummy pads 214b and avoid short circuits. As such, the costs and processing time of forming the conductive vias may be avoided.

Figure 5:
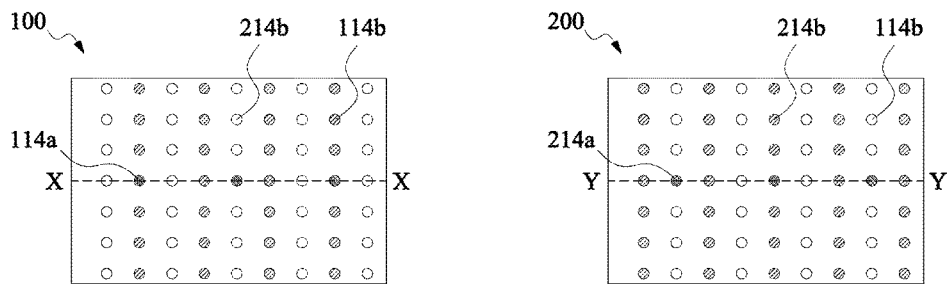
FIG. 5 depicts plan views of a top surface of two wafers in accordance with some exemplary embodiments.

Other embodiments are possible. FIG. 5 depicts plan views of the top surfaces of first wafer 100 and second wafer 200 are shown in accordance with some embodiments. The cross sectional views of FIGS. 1-3 of first wafer 100 are taken along the line X-X of first wafer 100, and the cross sectional views of FIGS. 1-3 of second wafer 200 are taken along the line Y-Y of second wafer 200.

As shown in FIG. 5, in some embodiments first dummy pads 114b and second dummy pads 214b may be arranged on top surfaces of first wafer 100 and second wafer 200, respectively, in interleaved straight lines. The straight lines are interleaved in the sense that when first wafer 100 and second wafer 200 are arranged in a face to face configuration, the straight lines of first dummy pads 114b are offset from and interleaved with the straight lines of second dummy pads 214b.

The example layouts of first dummy pads 114b on first wafer 100 and second dummy pads 214b on second wafer 200 as shown in FIGS. 4 and 5 are intended as examples only. Other patterns and designs that are suitable for particular applications may be used.

The distance between adjacent first dummy pads 114b in a straight line on the top surface of first wafer 100 may vary according to the size of first wafer 100 and second wafer 200. In some embodiments, the distance between adjacent first dummy pads 114b in a straight line along the top surface of first wafer 100 may be about 0.05 µm to about 10.0 µm, Similarly, the distance between adjacent second dummy pads 214b in a straight line on the top surface of second wafer 200 may vary according to the sizes of first wafer 100 and second wafer 200. In some embodiments, the distance between adjacent second dummy pads 214b in a straight line along the top surface of second wafer 200 may be about 0.05 µm to about 10.0 µm, The distance between adjacent straight lines of first dummy pads 114b on the top surface of first wafer 100 may vary according to the size of first wafer 100 and second wafer 200. In some embodiments, the distance between adjacent straight lines of first dummy pads 114b along the top surface of first wafer 100 may be about 0.05 µm to about 10.0 µm, Similarly, the distance between adjacent straight lines of second dummy pads 214b along the top surface of second wafer 200 may vary according to the sizes of first wafer 100 and second wafer 200. In some embodiments, the distance between adjacent straight lines of second dummy pads 214b along the top surface of second wafer 200 may be about 0.05 µm to about 10.0 µm.

In some embodiments, first connection pads 114a may be included as one or more points of a straight line of first dummy pads 114b on a top surface of first wafer 100. However, in some embodiments the positioning of first connection pads 114a is dependent upon the layout of the underlying electrical circuits, and first connection pads 114a may be positioned outside of a straight line of first dummy pads 114b. Similarly, in some embodiments second connection pads 214a may be included as one or more points of a straight line of second dummy pads 214b on a top surface of second wafer 200. However, in some embodiments the positioning of second connection pads 214a is dependent upon the layout of the underlying electrical circuits, and second connection pads 214a may be positioned outside of a straight line of second dummy pads 214b.

Because of the offset positioning of the interleaved straight lines, in some embodiments no physical connection is created between first dummy pads 114b on first wafer 100 and second dummy pads 214b on second wafer 200 when the wafers are arranged in a face to face configuration, and unintended short circuits may be avoided. Because of the offset positioning of first dummy pads 114b and second dummy pads 214b, in some embodiments one or more conductive vias between first connection pads 114a and uppermost first interconnect lines 112 in first wafer 100 are unnecessary to electrically isolate first dummy pads 114b and avoid short circuits. Similarly, in some embodiments, because of the offset positioning of first dummy pads 114b and second dummy pads 214b, in some embodiments one or more conductive vias between the second connection pads 214a and an uppermost second interconnect lines 212 in second wafer 200 are unnecessary to electrically isolate the second dummy pads 214b and avoid short circuits. As such, the costs and processing time of forming the conductive vias may be avoided.

An embodiment is a structure that includes a first dielectric layer overlying a first substrate. A first connection pad is disposed in the top surface of the first dielectric layer and contacts a first conductor disposed in the first dielectric layer. A major surface of the conductor extends in a direction that is parallel to the top surface of the first dielectric layer. A first dummy pad is disposed in the top surface of the first dielectric layer, the first dummy pad contacting the first conductor. A second dielectric layer overlies a second substrate. A second connection pad and a second dummy pad are disposed in the top surface of the second dielectric layer, the second connection pad bonded to the first connection pad, and the first dummy pad positioned in a manner that is offset from the second dummy pad so that the first dummy pad and the second dummy pad do not contact each other.

A further embodiment is a method. The method includes providing a first wafer having a plurality of first dummy pads on a top surface of the first wafer. The first dummy pads contact a first metallization layer of the first wafer. The metallization layer extends in a direction that is parallel to a major surface of the first wafer. The method also includes providing a second wafer having a plurality of second dummy pads on a top surface of the second wafer. The second dummy pads contact a second metallization layer of the second wafer. The method also includes bonding the first wafer to the second wafer in a manner that the top surface of the first wafer contacts the top surface of the second wafer and the plurality of first dummy pads are interleaved with the plurality of second dummy pads but do not contact the plurality of second dummy pads.

A further embodiment is a structure. The structure includes a first wafer, which includes a first substrate. A first dielectric layer overlies the first substrate. A first metallization layer is disposed in the first dielectric layer, the first metallization layer extending in a direction that is parallel to a major surface of the first substrate. A first connection pad is disposed in a top surface of the first dielectric layer and contacting the first metallization layer. A plurality of first dummy pads is disposed in the top surface of the first dielectric layer. One or more of the plurality of first dummy pads contacting the first metallization layer. The structure also includes a second wafer that includes a second substrate. A second dielectric layer overlies the second substrate. A second metallization layer is disposed in the second dielectric layer. A second connection pad is disposed in a top surface of the second dielectric layer and contacts the second metallization layer. A plurality of second dummy pads is disposed in the top surface of the second dielectric layer and contacts the second metallization layer. The second metallization layer extends in a direction that is parallel to a major surface of the second substrate. The first wafer is bonded to the second wafer in a manner that the first connection pad contacts the second connection pad. The plurality of first dummy pads is positioned in a manner that is offset from the plurality of second dummy pads. The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
providing a first wafer having a plurality of first dummy pads exposed along a first surface of the first wafer, the plurality of first dummy pads directly contacting a first metallization layer of the first wafer, the first metallization layer being closer to a semiconductor substrate of the first wafer than the first dummy pads, wherein edges of the first metallization layer extend beyond edges of the plurality of first dummy pads in directions that are parallel to a major surface of the first wafer;
providing a second wafer having a plurality of second dummy pads exposed along a first surface of the second wafer, the plurality of second dummy pads contacting a second metallization layer of the second wafer; and
bonding the first wafer to the second wafer in a manner that the first surface of the first wafer contacts the first surface of the second wafer and the plurality of first dummy pads are interleaved with the plurality of second dummy pads but do not contact the plurality of second dummy pads.

2. The method according to claim 1, wherein:
the first wafer further comprises a plurality of first connection pads exposed along the first surface of the first wafer; and
the second wafer further comprises a plurality of second connection pads exposed along the first surface of the second wafer; and
bonding the first wafer to the second wafer comprises bonding one of the plurality of first connection pads to one of the plurality of second connection pads.

3. The method according to claim 1, wherein four of the plurality of first dummy pads are arranged in a rhombus shape in a plan view of the first wafer.

4. The method according to claim 3, wherein the plurality of first dummy pads is arranged to form a plurality of rhombus shapes in a plan view of the first wafer.

5. The method according to claim 3, wherein the plurality of first dummy pads are arranged in a plurality of straight lines and the plurality of second dummy pads are arranged in a plurality of straight lines.

6. The method according to claim 1, wherein the first wafer is bonded to the second wafer using hybrid bonding.

7. The method according to claim 1, wherein the second metallization layer of the second wafer extends in a direction that is parallel to a major surface of the second wafer.

8. A method, comprising:
forming a plurality of first external contacts, the plurality of first external contacts being exposed along a first surface of a first wafer, wherein the plurality of first external contacts comprises a plurality of first connectors and a plurality of first dummy pads, wherein the plurality of first dummy pads and the plurality of first connectors are jointly arranged so that the plurality of first dummy pads and the plurality of first connectors are uniformly distributed in a plan view of the first wafer, and wherein the first wafer further comprises a plurality of conductive lines underlying the plurality of first dummy pads and the plurality of first connectors, and a first dummy pad of the plurality of first dummy pads and a first connector of the plurality of first connectors are directly electrically connected to a same underlying conductive line of the plurality of conductive lines, the same underlying conductive line being located further within the first wafer than the plurality of first dummy pads;
forming a plurality of second external contacts, the plurality of second external contacts being exposed along a first surface of a second wafer, wherein the plurality of second external contacts comprises a plurality of second connectors and a plurality of second dummy pads, wherein the plurality of second dummy pads and the plurality of second connectors are jointly arranged so that the plurality of second dummy pads and the plurality of second connectors are uniformly distributed in a plan view of the second wafer; and
bonding the first surface of the first wafer to the first surface of the second wafer by bonding the plurality of first connectors and the plurality of second connectors using direct metal-to-metal bonding.

9. The method according to claim 8, wherein the plurality of first dummy pads are offset from the plurality of second dummy pads.

10. The method according to claim 8, wherein the plurality of first dummy pads is arranged in a rhombus pattern.

11. The method according to claim 10, wherein the plurality of second dummy pads is arranged in a rhombus pattern.

12. The method according to claim 11, wherein after the first surface of the first wafer is bonded to the first surface of the second wafer, the rhombus pattern of the plurality of first dummy pads overlaps the rhombus pattern of the plurality of second dummy pads.

13. The method according to claim 8, wherein the plurality of first connectors is formed in a first dielectric layer of the first wafer, the plurality of second connectors is formed in a second dielectric layer of the second wafer, and wherein bonding the first surface of the first wafer to the first surface of the second wafer further comprises bonding the first dielectric layer to the second dielectric layer; and
wherein, after bonding the first surface of the first wafer to the first surface of the second wafer, surfaces of the plurality of first dummy pads contact the second dielectric layer and surfaces of the plurality of second dummy pads contact the first dielectric layer.

14. The method according to claim 8, wherein surfaces of each of the plurality of first dummy pads is planar with the first surface of the first wafer.

15. The method according to claim 8, further comprising performing a planarization process on the first surface of the first wafer and the first surface of the second wafer before bonding the first surface of the first wafer to the first surface of the second wafer.

16. The method according to claim 8, wherein the joint arrangement of the plurality of first dummy pads and the plurality of first connectors substantially covers the first surface of the first wafer.

17. A method, comprising:
providing a first substrate, wherein the first substrate comprises:
a first dielectric layer;
a first plurality of metal pads, wherein the first plurality of metal pads comprises a plurality of first connectors and a plurality of first dummy pads, and wherein the first plurality of metal pads comprises four adjacent metal pads disposed in a rhombus shape, wherein a first connector of the plurality of first connectors physically contacts an underlying conductive line of a plurality of conductive lines, the plurality of underlying conductive lines being routed in directions that are parallel to a major surface of the first substrate, and the underlying conductive line of the plurality of conductive lines having a different size than the first connector in a plan view;
providing a second substrate, wherein the second substrate comprises:
a second dielectric layer;

a second plurality of metal pads, wherein the second plurality of metal pads comprises a plurality of second connectors and a plurality of second dummy pads, and wherein the second plurality of metal pads comprises four adjacent metal pads disposed in a rhombus shape; and bonding the first dielectric layer to the second dielectric layer, wherein the plurality of first connectors are directly electrically connected to the plurality of first dummy pads through a conductive element, the conductive element being located on an opposite side of the plurality of first connectors from the second plurality of metal pads.

18. The method according to claim 17, further comprising bonding the plurality of first connectors to the plurality of second connectors.

19. The method according to claim 17, wherein the plurality of first dummy pads are directly physically coupled to an underlying conductive line of the plurality of conductive lines.

20. The method according to claim 17, wherein four of the plurality of first dummy pads are arranged in a rhombus shape in a plan view of the first wafer.

* * * * *